(12) United States Patent
Kubo

(10) Patent No.: US 7,128,131 B2
(45) Date of Patent: Oct. 31, 2006

(54) HEAT SINK FOR ELECTRONIC DEVICES AND HEAT DISSIPATING METHOD

(75) Inventor: Yoshinari Kubo, Tokyo (JP)

(73) Assignee: The Furukawa Electric Co., Ltd. (JP)

( * ) Notice: Subject to any disclaimer, the term of this patent is extended or adjusted under 35 U.S.C. 154(b) by 0 days.

(21) Appl. No.: 10/472,025

(22) PCT Filed: Jul. 31, 2002

(86) PCT No.: PCT/JP02/07776

§ 371 (c)(1),
(2), (4) Date: Sep. 18, 2003

(65) Prior Publication Data

US 2004/0182552 A1  Sep. 23, 2004

(30) Foreign Application Priority Data

Jul. 31, 2001 (JP) .............................. 2001-231944

(51) Int. Cl.
*H05K 7/20* (2006.01)

(52) U.S. Cl. .............................. 165/80.3; 165/104.33; 165/185; 257/715; 361/700

(58) Field of Classification Search ........... 165/104.21, 165/104.33, 80.4, 185; 361/700, 697; 257/714–716; 174/15.2
See application file for complete search history.

(56) References Cited

U.S. PATENT DOCUMENTS

| | | | | | |
|---|---|---|---|---|---|
| 5,509,465 | A | * | 4/1996 | Lai ............................ | 165/80.3 |
| 5,558,155 | A | * | 9/1996 | Ito ............................. | 165/80.3 |
| 5,959,837 | A | * | 9/1999 | Yu ............................. | 361/697 |
| 6,006,827 | A | * | 12/1999 | Lu ............................. | 165/182 |
| 6,336,498 | B1 | * | 1/2002 | Wei ........................... | 165/80.3 |
| 6,340,056 | B1 | * | 1/2002 | Huang et al. ............... | 165/185 |
| 6,367,541 | B1 | * | 4/2002 | McCullough .............. | 165/80.3 |
| 6,382,307 | B1 | * | 5/2002 | Wang et al. ................ | 165/80.3 |
| 6,474,407 | B1 | * | 11/2002 | Chang et al. ............... | 165/80.3 |
| 2001/0001416 | A1 | * | 5/2001 | Lee et al. ................... | 165/80.3 |
| 2003/0094273 | A1 | * | 5/2003 | Toth et al. .................. | 165/183 |

FOREIGN PATENT DOCUMENTS

| | | |
|---|---|---|
| JP | 09-331177 | 12/1997 |
| JP | 11-074426 | 3/1999 |
| JP | 11-298180 | 10/1999 |
| JP | 200-114440 | 4/2000 |

\* cited by examiner

*Primary Examiner*—Leonard R. Leo
(74) *Attorney, Agent, or Firm*—Cantor Colburn LLP

(57) ABSTRACT

A heat sink according to the present invention is configured to comprise:
  a plurality of heat dissipating fins having at least bottom portions which form a heat receiving surface thermally connected to a heat generating electronic component; and
  a heat-transfer connecting member for, by passing through each of said plurality of heat dissipating fins arranged in parallel, connecting said plurality of heat dissipating fins in such a manner that said bottom portions form said heat receiving surface.

12 Claims, 11 Drawing Sheets

HEAT SINK FOR ELECTRONIC DEVICES AND HEAT DISSIPATING METHOD

BACKGROUND OF THE INVENTION

1. Field of the Invention

The present invention relates to a heat sink for cooling various heat generating electronic components, particularly, a semiconductor device and the like, and a cooling method.

2. Description of Related Art

When electronic components such as a semiconductor device, which are mounted on various devices including personal computers and the like or on electrical or electronic installations including electronic equipment and the like are used, they inevitably generate heat to some extent. Cooling of such generated heat is becoming a serious technical problem in recent years. Typically known as methods for cooling electrical or electronic devices which require cooling, are a method of lowering air temperature inside the housing of the device by a fan mounted on the device, a method of cooling a heat generating device, for example, a heat generating electronic component by attaching a cooling body on the heat generating device, or the like to cool same, and the like.

Such cooling bodies as mentioned above include a heat conductive metal member such as metal plate or metal block. For example, heat generated by a heat generating device is received by a metal block and then, the heat is dissipated by means of a heat dissipating fin mounted on the metal block. To have a limited envelop volume which is light weighted but has a wider heat dissipating area, (mountain-shaped) corrugated fins, caulked fins or the like are effective and widely used. In order to improve the heat conductivity, a heat transfer rubber sheet or the like is used between the heat generating device and the metal member. Further, as a method for fixing heat dissipating fins on the aforementioned metal block, there are used methods of brazing, soldering, caulking, adhering by use of an adhesive agent or a double-sided adhesive tape, screwing or the like.

According to the aforementioned method in which heat from the heat generating device is first received by a heat transfer metal block or the like and then, dissipated to a predetermined area or an open air by way of heat dissipating fins fixed on the metal block or the like, a metal plate, metal block or the like is placed at a heat path between a heat generating device, which is a heat source, and the heat dissipating fins, and then, there is contact heat resistance produced between the metal plate, metal block or the like and the heat dissipating fins, which presents a problem that heat dissipating performance is deteriorated over the whole heat sink.

In addition, there is another problem that cost is increased due to the need to prepare a member other than the heat dissipating fins and joint it with the heat dissipating fins. Further, when the member other than the heat dissipating fins and the heat dissipating fins are jointed to another member, there is also produced contact resistance. This presents a problem that contact resistance values vary dependent on the products. Furthermore, there is still another problem that a heat sink causes unnecessary radiation, which lowers heat cooling efficiency.

Accordingly, an object of the present invention is to solve the aforementioned conventional problems and to provide a heat sink for cooling electronic devices or the like, which has a reduced contact heat resistance between a metal block and heat dissipating fins, uniform cooling performance irrespective of products, reduced unnecessary radiation and excellent cooling performance, and a heat dissipating method.

SUMMARY OF THE INVENTION

The inventor of the present invention has been studying hard to solve the above-mentioned problems in the conventional art. As a result, he has obtained a heat sink for cooling electronic devices or the like, which has a reduced contact heat resistance between a metal block and heat dissipating fins, uniform cooling performance irrespective of products, reduced unnecessary radiation and excellent cooling performance, and a heat dissipating method.

The present invention was carried out in view of the foregoing. A first embodiment of a heat sink of the present invention is a heat sink comprising:

a plurality of heat dissipating fins having at least bottom portions which form a heat receiving surface thermally connected to a heat generating electronic component; and a heat-transfer connecting member for, by passing through each of said plurality of heat dissipating fins arranged in parallel, connecting said plurality of heat dissipating fins in such a manner that said bottom portions form said heat receiving surface.

A second embodiment of a heat sink of the present invention is a heat sink in which each of said heat dissipating fins has at least a portion which functions as a spring.

A third embodiment of a heat sink of the present invention is a heat sink in which said connecting member which passes through said plurality of heat dissipating fins is arranged so as to press down the heat generating electronic component via said heat dissipating fins, and fixes said plurality of heat dissipating fins while said heat receiving surface is thermally connected to the heat generating electronic component.

A fourth embodiment of a heat sink of the present invention is a heat sink in which said connecting member comprises a heat pipe.

A fifth embodiment of a heat sink of the present invention is a heat sink comprising:

a plurality of heat dissipating fins having at least bottom portions which form a plurality of heat receiving surfaces thermally connected to a plurality of heat generating electronic components of different heights mounted on a printed board; and a connecting member for, by passing through each of said plurality of heat dissipating fins arranged in parallel, connecting said plurality of heat dissipating fins in such a manner that said bottom portions form said heat receiving surfaces.

A sixth embodiment of a heat sink of the present invention is a heat sink further comprising a fixing member for fixing said plurality of heat dissipating fins, which are connected by said connecting member, by pressing said plurality of heat dissipating fins against said heat generating electronic components while said heat receiving surfaces are thermally connected to said heat generating electronic components.

A seventh embodiment of a heat sink of the present invention is a heat sink further comprising an electrically conductive sheet for shielding a magnetic field arranged between upper portions of said heat dissipating fins and said fixing member.

A eighth embodiment of a heat sink of the invention is a heat sink in which each of said heat dissipating fins comprises an approximately U-shaped heat dissipating fin having an upper portion, a main body portion and a bottom portion, and includes a portion having a stopper function to maintain a predetermined fin pitch at said upper portion.

Another embodiment of a heat sink of the present invention is a heat sink in which each of said heat dissipating fins comprises an approximately U-shaped heat dissipating fin having an upper portion, a main body portion and a bottom portion, and includes a portion having a stopper function to maintain a predetermined fin pitch at said upper portion.

Still another embodiment of a heat sink of the present invention is a heat sink in which said heat dissipating fins are connected to one end of a heat pipe, and an other end of the heat pipe is further thermally connected to another heat dissipating portion or another heat receiving portion.

Yet another embodiment of a heat sink of the present invention is a heat sink in which said heat dissipating fins are approximately L-shaped heat dissipating fins or approximately U-shaped heat dissipating fins having said bottom portions, and comprise at least two groups of heat dissipating fins of different heights, corresponding to at least two heat generating electronic components of different heights.

A first embodiment of a method for heat dissipating an electronic device of the present invention is a method for heat dissipating an electronic device which comprises the steps of: arranging a plurality of heat dissipating fins in parallel in such a manner that bottom portions of said heat dissipating fins form a heat receiving surface; connecting said plurality of heat dissipating fins arranged in parallel by a connecting member which passes through each of said heat dissipating fins; and thermally connecting said heat receiving surface formed of the bottom portions of said plurality of heat dissipating fins to a heat generating electronic component.

A second embodiment of a method for heat dissipating an electronic device of the present invention is a method for heat dissipating an electronic device which comprises the steps of: arranging a plurality of heat dissipating fins in parallel in such a manner that bottom portions of said heat dissipating fins form a plurality of heat receiving surface, connecting is said plurality of heat dissipating fins arranged in parallel by a connecting member which passes through each of said heat dissipating fins, and thermally connecting said plurality of heat receiving surfaces formed of the bottom portions of said plurality of heat dissipating fins to a plurality of heat generating electronic components of different heights mounted on a printed board.

BRIEF DESCRIPTION OF THE DRAWINGS

FIG. 7 is a view showing an embodiment of a heat sink of which a connecting member has an end fastened on a printed board with a screw or the like;

FIG. 23 is a view showing an embodiment of a heat sink of which an end of a connecting member and a printed board are fastened on a housing with screws or the like;

DETAILED DESCRIPTION OF THE PREFERRED EMBODIMENTS

Embodiments of a heat sink and heat dissipating method in accordance with the present invention will now be described in detail with reference to the accompanying drawings.

The heat sink in accordance with the present invention comprises: a plurality of heat dissipating fins having bottom portions which form a heat receiving surface thermally connected to a heat generating electronic component; and a connecting member for, by passing through each of the plurality of heat dissipating fins which are arranged in parallel, connecting the plurality of heat dissipating fins in such a manner that the bottom portions of the heat dissipating fins form the heat receiving surface. Such a heat dissipating fin may be an approximately L-shaped heat dissipating fin or approximately U-shaped heat dissipating fin having a bottom portion.

Each of the heat dissipating fins has at least a bottom portion, as mentioned above, and as is important, when the plurality of heat dissipating fins are arranged in parallel, bottom portions thereof form a heat receiving surface which is thermally connected to a heat generating electronic component mounted on a printed board. In other words, the heat receiving surface which is formed of the bottom portions is directly connected to the heat generating electronic component. The heat receiving surface which is formed of the bottom portions may be thermally connected to the heat generating electronic component via a heat transfer material.

Figure 1:
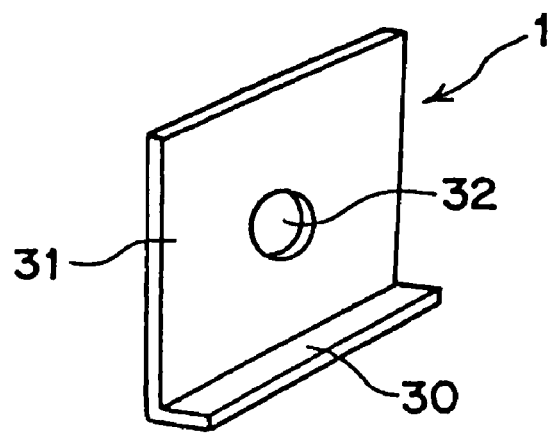
FIG. 1 is a view showing an embodiment of a heat dissipating fin in accordance with the present invention.
Figure 2:
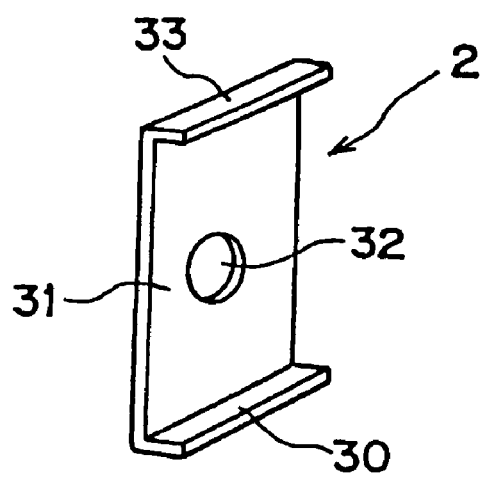
FIG. 2 is a view showing another embodiment of a heat dissipating fin in accordance with the present invention.

FIG. 1 is a view showing an embodiment of a heat dissipating fin in accordance with the present invention. As shown in FIG. 1, this heat dissipating fin 1 is an approximately L-shaped heat dissipating fin comprising a bottom portion 30 and a vertical portion 31. In the center of the vertical portion, a hole 32 is provided through which a connecting member passes. When the plurality of heat dissipating fins 1 are arranged in parallel, paralleled bottom portions thereof 30 form a flat heat receiving surface, for example. FIG. 2 is another embodiment of a heat dissipating fin in accordance with the present invention. As shown in FIG. 2, this heat dissipating fin 2 is an approximately U-shaped heat dissipating fin having an upper portion 33, a vertical portion 31 and a bottom. In the center of the vertical portion, a hole 32 is provided through which a connecting member passes.

Figure 3:
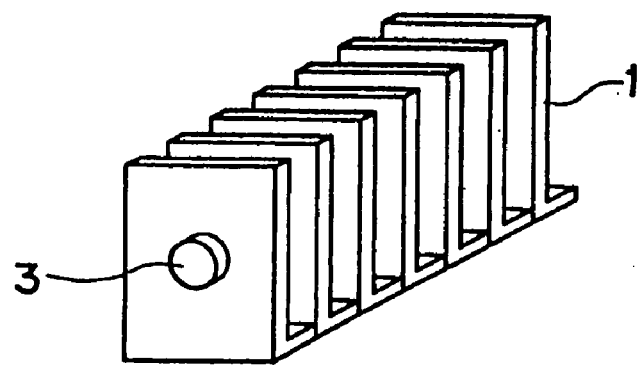
FIG. 3 is a view showing an embodiment of a heat sink in accordance with the present invention.

FIG. 3 is a view showing an embodiment of a heat sink in accordance with the present invention. Specifically, the heat sink in accordance with the present invention is configured to have a plurality of approximately L-shaped heat dissipating fins arranged in parallel and a connecting member for, by passing through each of the plurality of heat dissipating fins in parallel, connecting the plurality of heat dissipating fins in such a manner that the bottom portions thereof form a heat receiving surface. As illustrated in FIGS. 1 and 3, the approximately L-shaped heat dissipating fins 1 each having a bottom portion 30 and a vertical portion 31 are arranged in parallel, and a connecting member 3 is provided for connecting the plurality of approximately L-shaped heat dissipating fins 1. In thus formed heat sink, the bottom portions of the heat dissipating fins 1 form a heat receiving surface.

Figure 4:
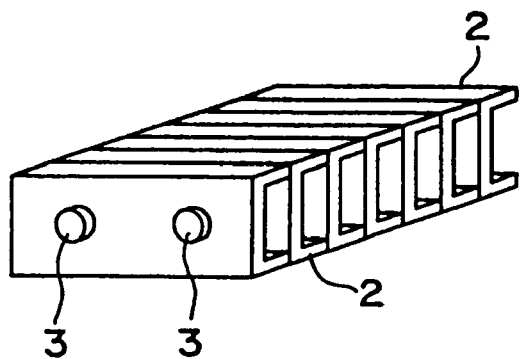
FIG. 4 shows another embodiment of a heat sink in accordance with the present invention.

FIG. 4 is a view showing another embodiment of a heat sink in accordance with the present invention. Specifically, the heat sink in accordance with the present invention is configured to have a plurality of approximately U-shaped heat dissipating fins arranged in parallel, and a connecting member for, by passing through each of the plurality of heat dissipating fins, connecting the plurality of heat dissipating fins in such a way that bottom portions thereof form a heat receiving surface. As illustrated in FIGS. 1 and 4, the approximately U-shaped heat dissipating fins 2 each having an upper portion 33 a vertical portion 31 and a bottom portion 30 are arranged in parallel, and a connecting member 3 is provided for connecting the plurality of approximately U-shaped heat dissipating fins 2. In thus formed heat sink, the bottom portions of the heat dissipating fins 2 form a heat receiving surface. Further, like the bottom portions, paralleled upper portions form a flat surface. The number of connecting members 3 is not limited to one, but, two or more connecting members may be provided, as illustrated in FIG. 4.

Further, according to the present invention, the aforementioned heat sink may further comprise a fixing member for fixing the plurality of heat dissipating fins, which are connected by a connecting member, to a printed board when the heat receiving surface is left thermally connected to a heat generating electronic component.

Figure 5:
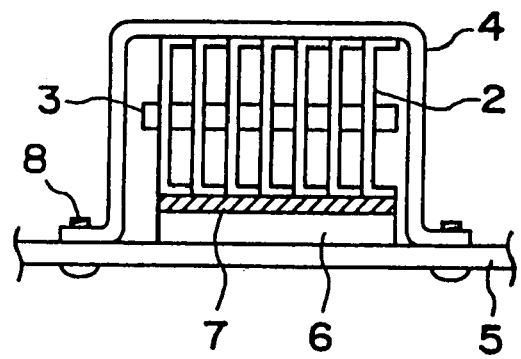
FIG. 5 is a view showing an embodiment of a heat sink of the present invention which includes a fixing member.

FIG. 5 is a view showing an embodiment of a heat sink in accordance with the present invention which includes a fixing member. As shown in FIG. 5, a heat generating electronic component 6 is mounted on a printed board 5. On the heat generating electronic component, a heat sink is mounted via a heat transfer member 7 such as a heat transfer sheet, a metal plate, a double-sided adhesive tape, a thermal rubber or the like, said heat sink being configured to have, for example, a plurality of approximately U-shaped heat dissipating fins 2, as shown in FIG. 4, arranged in parallel and connected by a connecting member 3. When the heat sink thus arranged on the printed board is left pressed down in the direction of the printed board by means of a fixing member 4, the fixing member 4 may be fastened on the printed board with a screw 8. This allows further reduction of the heat resistance between the heat generating electronic component and the heat transfer sheet and between the heat transfer sheet and the heat dissipating fins.

In the heat sink of the present invention, the aforementioned connecting member may comprise a heat pipe. Further, while an end of the heat pipe is connected to the heat dissipating fins, the other end may be thermally connected to another heat dissipating portion or another heat receiving portion.

The heat pipe includes a hermetically sealed cavity, in which working fluid is received. This working fluid is phase-transformed and moved, thereby transferring heat. A part of heat is conducted directly through a container which forms the heat pipe, while most of the heat is transferred by phase transformation and movement of the working fluid.

Specifically, at the heat absorbing side of a heat pipe, working fluid is vaporized by heat conducted through a material forming the container of the heat pipe and the vaporized working fluid moves to the heat dissipating side of the heat pipe. At the heat dissipating side, the vaporized working fluid is cooled and returned to a liquid phase. Then, the working fluid which has come back to the liquid phase flows back to the heat absorbing side. Such phase transformation and movement of the working fluid allows the heat to be transferred.

Typically, water, aqueous solution, alcohol, organic solvent or the like are used as working fluid in the heat pipe. For special purposes, mercury is sometimes used as working fluid. Utilizing actions such as phase transformation and the like of the working fluid as described above, the heat pipe is manufactured in such a manner that gas or the like other than the working fluid is prevented from being caught in the hermetically sealed cavity. Such impure ingredients include air which is mixed during manufacturing, carbon dioxide gas which is dissolved in the working fluid, and the like. Where the shape of a heat pipe is concerned, a typical round heat pipe as well as a flat-type heat pipe is widely used. Further, the heat transferred by a heat pipe may be subjected to forced cooling by means of a fan or the like.

Figure 6:
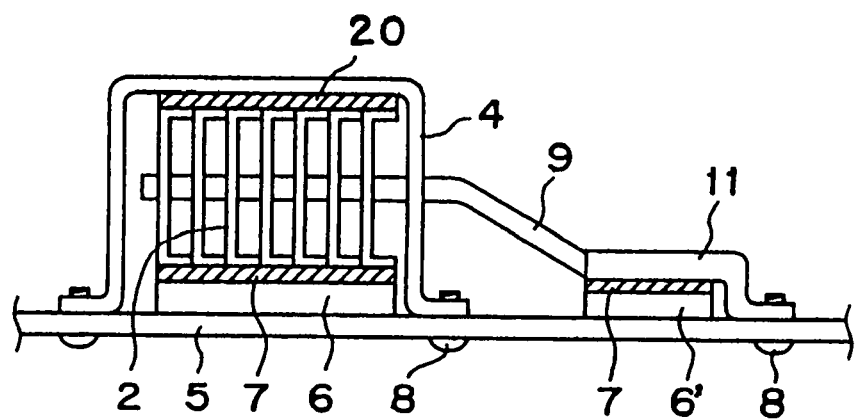
FIG. 6 is a view showing an embodiment of a heat sink of the present invention in which a connecting member comprises a heat pipe.

FIG. 6 is a view showing an embodiment of a heat sink in accordance with the present invention of which a connecting member comprises a heat pipe. As illustrated in FIG. 6, a heat generating electronic component 6 is mounted on a printed board 5. On the heat generating electronic component 6, a heat sink is mounted via a heat transfer member 7 such as a heat transfer sheet or the like, said heat sink being configured to have, for example, a plurality of approximately U-shaped heat dissipating fins 2, as illustrated in FIG. 4, arranged in parallel and connected to each other by a heat pipe 9. In addition, while the heat sink thus mounted on the printed board is left pressed down in the direction of the printed board by a fixing member 4, the fixing member 4 is fastened on the printed board with a screw 8. An electrically conductive sheet 20 for magnetic shielding may be arranged between the upper portions of the heat dissipating fins 2 of the heat sink and the fixing member 4. Thus arrangement of the electrically conductive sheet 20 enables potential difference between the fixing member and the heat dissipating fins to be eliminated.

The aforementioned other end of the heat pipe is further extended to be mounted on another heat generating electronic component 6' mounted on the printed board. Specifically, onto the heat generating electronic component 6' there is provided a metal heat receiving block 11 via a heat transfer sheet 7. The end of the heat pipe is fitted into a hole provided in the heat receiving block, put in close contact with the heat receiving block, and thus, the end is thermally connected to the heat receiving block. Thus arrangement of the heat pipe makes it possible to transfer heat generated by the heat generating electronic component 6' to the heat dissipating fins, thereby to dissipate the heat.

When the heat pipe is connected not to the heat generating electronic component 6' but to another heat dissipating fins, the heat from the heat generating electronic component 6' can be transferred to another heat dissipating fins, thereby making it possible to effectively cool a high-density heat generating electronic component of high heating value.

Materials of the container of the heat pipe in accordance with the present invention may be metal with excellent heat conductivity, such as copper, aluminum or the like. To manufacture a flat-type heat pipe container, aluminum is preferably used since it has excellent workability. A wick may be formed with the same material as that used in the container of the flat-type heat pipe. Water, substituted fleon or fluorinate may be used as working fluid in accordance with compatibility with the material of the heat pipe container.

Further, in the heat sink according to the present invention, the aforementioned connecting member, which passes through the plurality of heat dissipating fins, may secure the plurality of heat dissipating fins when the connecting member is arranged to press the heat generating electronic component via the heat dissipating fins and the heat receiving surface is left thermally connected to the heat generating electronic component. In other words, without using another member, such as a fixing member as mentioned above, an end of the connecting member is fastened on the printed board with a screw or the like to secure the heat sink to the printed board.

Figure 7:
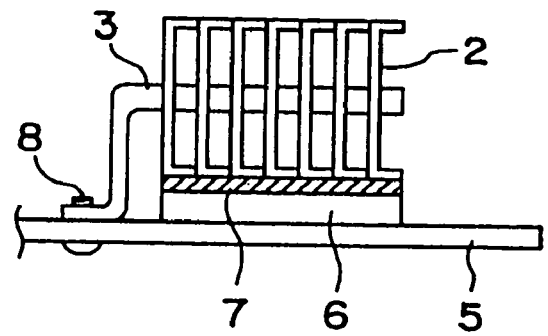

FIG. 7 is a view showing an embodiment of a heat sink of which a connecting member has an end fastened on a printed board with a screw or the like. As illustrated in FIG. 7, a heat generating electronic component 6 is mounted on the printed board 5. On the heat generating electronic component 6, a heat sink is mounted via a heat transfer member 7 such as a heat transfer sheet or the like, said heat sink being configured to a plurality of approximately U-shaped heat dissipating fins 2 arranged in parallel and connected by a connecting member 3. In this embodiment, an end of the connecting member 3 is further extended, bent downwards onto the printed board and fastened on the printed board with a screw 8.

According to the present embodiment, it is not necessary to prepare another fixing member, thereby making it possible to reduce components in number.

Further, the heat sink of the present invention comprises:

a plurality of heat dissipating fins having at least bottom portions which form a heat receiving surface thermally connected to a plurality of heat generating electronic components of different heights mounted on the printed board; and a connecting member for, by passing through each of the plurality of heat dissipating fins in parallel, connecting the plurality of heat dissipating fins in such a manner that the bottom portions form the heat receiving surface.

Such heat dissipating fin is an approximately L-shaped heat dissipating fin or approximately U-shaped heat dissipating fin. The plurality of heat dissipating fins may fall into at least two groups of heat dissipating fins of different heights corresponding to the at least two heat generating electronic components of different heights.

Figure 8:
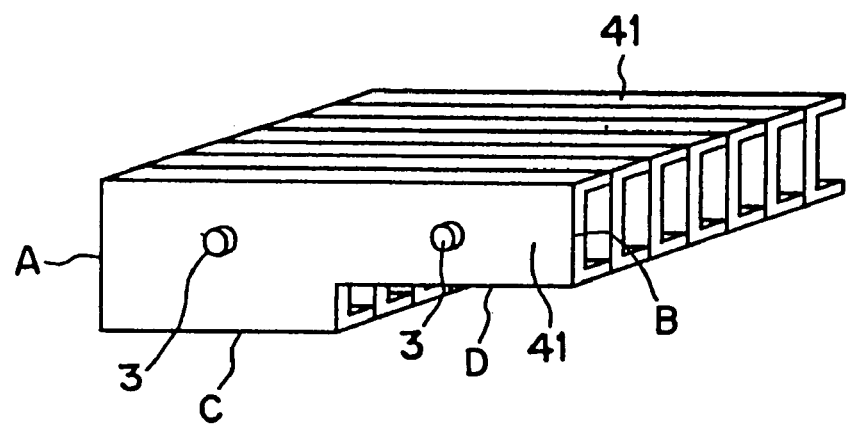
FIG. 8 is a view showing an embodiment of a heat sink in accordance with the present invention for cooling two heat generating electronic components having different heights.

FIG. 8 is a view illustrating an embodiment of a heat sink according to the present invention for cooling two heat generating electronic components of different heights.

As shown in FIG. 8, in the present embodiment, heat dissipating fins 41 have bottom portions which form two heat receiving surfaces C and D thermally connected to the two heat generating electronic components of different heights mounted on the printed board. In other words, the heat dissipating fins 41 consist of a part of height A and a part of height B. The heights A and B correspond to the heights of the heat generating electronic components mounted on the printed board. That is, the heights A and B of the heat dissipating fins are determined corresponding to the heights of the heat generating electronic components in such a way that the distance from the lower end of the printed board to the upper end of the heat dissipating fins remains the same for the both heights of heat dissipating fins. The embodiment of the heat sink in accordance with the present invention comprises a plurality of approximately U-shaped heat dissipating fins 41, arranged in parallel, which are thermally connected to two heat generating electronic components via a heat transfer member such as a heat transfer sheet or the like, and a connecting member 3 for connecting the heat dissipating fins.

Figure 9A:
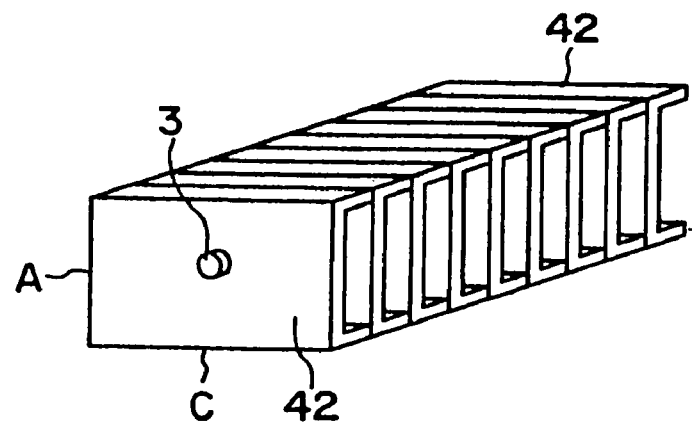
FIGS. 9A and 9B are views each showing another embodiment of heat dissipating fins of the heat sink in accordance with the present invention for cooling two heat generating electronic components of different heights.
Figure 9B:
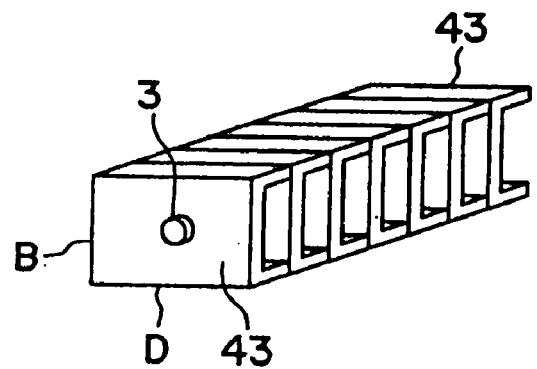

FIGS. 9A and 9B are views each showing another embodiment of heat-dissipating fins of the heat sink in accordance with the present invention for cooling two heat generating electronic components of different heights In the present embodiment, the heat dissipating fins include two sets of a plurality of paralleled heat dissipating fins, 42 and 43, corresponding to the two heat generating electronic components of different heights. Each of the heat dissipating fins 42 has a height A and a bottom portion which forms a heat receiving surface C. The heat dissipating fins are connected to each other by a connecting member 3. Further, each of the respective heat dissipating fins 43 has a height B and a bottom portion which forms a heat receiving surface D. The heat dissipating fins are connected by a connecting member 3. The set of plurality of heat dissipating fins 42 and the other set of plurality of heat dissipating fins 43 may be arranged in parallel or in series, corresponding to the arrangement of the heat generating electronic components. Depending on the aforementioned arrangement, the position and length of the connecting member can be determined.

Figure 10:
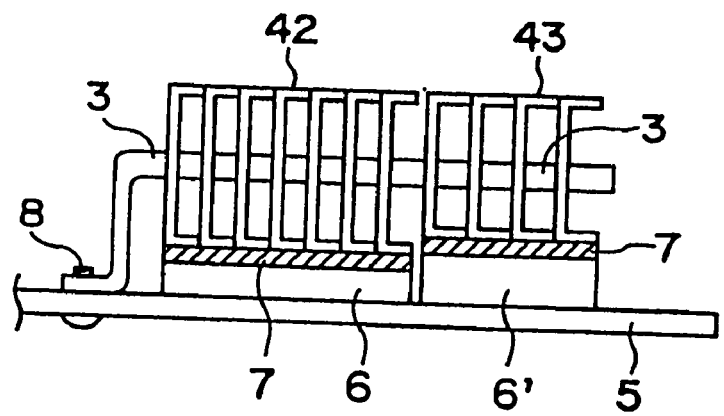
FIG. 10 is a view showing an embodiment of a heat sink in accordance with the present invention which cools heat generating electronic components of different heights.

FIG. 10 is a view illustrating an embodiment of a heat sink according to the present invention for cooling two heat generating electronic components of different heights. Specifically, according to the embodiment as shown in this figure the aforementioned two sets of plurality of paralleled heat dissipating fins are arranged in series.

As illustrated in FIG. 10, two heat generating electronic components 6 and 6' are mounted on the printed board 5. On the heat generating electronic component 6, a plurality of approximately U-shaped heat dissipating fins 42 of height A are arranged in parallel via a heat transfer member 7 such as a heat transfer sheet or the like. Further, on the heat generating electronic component 6', a plurality of approximately U-shaped heat dissipating fins 43 of height B are arranged in parallel via a heat transfer member 7 such as a heat transfer sheet or the like. The heat dissipating fins 42 are the heat dissipating fins 43 are connected respectively by the same connecting member 3. An end of the connecting member 3 is further extended, bent downwards onto the printed board and fastened on the printed board with a screw 8. According to this embodiment, heat receiving surfaces of the two sets of paralleled heat dissipating fins, corresponding to the heat generating electronic components of different height mounted on the printed board, are connected to the heat generating components via the heat transfer sheets, respectively, and fixed by the connecting member.

Figure 11A:
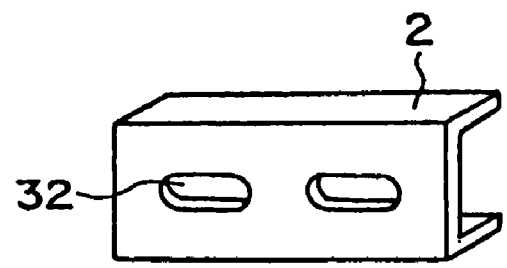
FIGS. 11A to 11C are views each showing an embodiment of fin-fixing holes in a heat dissipating fin according to the present invention.
Figure 11B:
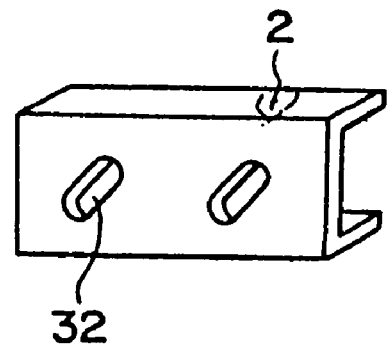
Figure 11C:
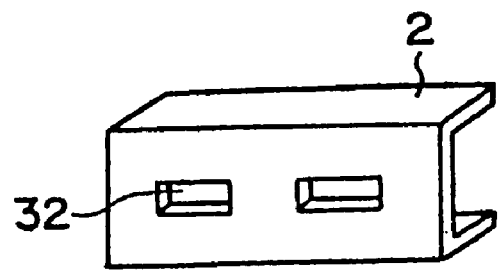

FIGS. 11A to 11C are views each showing an embodiment of fin-fixing holes in a heat dissipating fin according to the present invention. As illustrated in FIG. 11A, the approximately U-shaped heat dissipating fin is provided with elliptical holes 32. As illustrated in FIG. 11B, the approximately U-shaped heat dissipating fin is provided with elliptical holes 32 arranged in a slanting position. As illustrated in FIG. 11C, the approximately U-shaped heat dissipating fin is provided with rectangular holes 32. Such holes provided to the heat dissipating fins make it possible to produce a better flow of wind through the heat dissipating fins and to lower the pressure loss.

Figure 12:
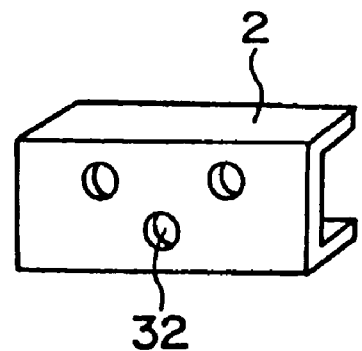
FIG. 12 is a view showing an embodiment of arrangement of fin-fixing holes of a heat dissipating fin in accordance with the present invention.

FIG. 12 is a view illustrating an embodiment of arrangement of fin-fixing holes in a heat dissipating fin according to the present invention. As illustrated in FIG. 12, round holes 32 are roughly arranged at two, upper and lower parts. Such change of arrangement of the holes makes it possible to produce a better flow of wind through the heat dissipating fins and to lower the pressure loss, thereby enhancing the heat dissipating effect.

Figure 13:
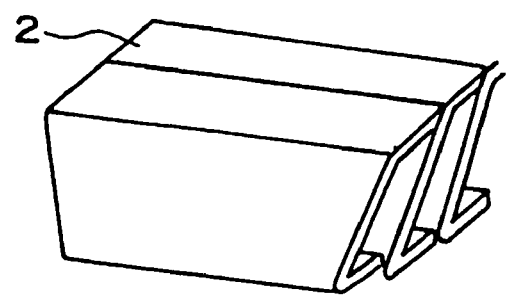
FIG. 13 is a view showing another configuration of heat dissipating fins.

FIG. 13 is a view illustrating another configuration of heat dissipating fins. As illustrated in FIG. 13, a lower part of each of the heat dissipating fins is prepared to be smaller than the upper part thereof. Such setting of the heat dissipating fins allows a flow of wind to be directed downwards, thereby lowering the pressure loss.

Figure 14:
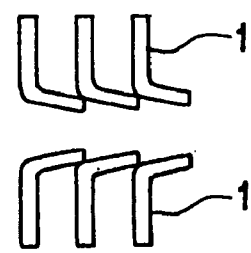
FIG. 14 is a view showing another embodiment of heat dissipating fins.
Figure 15:
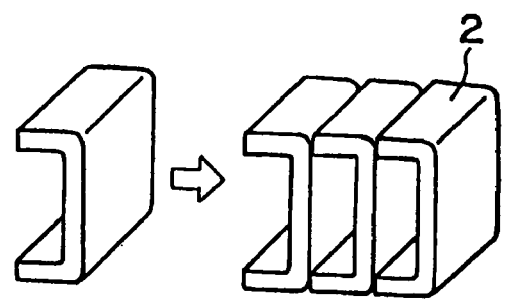
FIG. 15 is a view showing still another embodiment of heat dissipating fins.

FIG. 14 is a view illustrating another embodiment of heat dissipating fins. As illustrated in FIG. 14, in order to fix a plurality of heat dissipating fins 1 in parallel without using a connecting bar member, each of the heat dissipating fins is fitted into a burring-worked hole of an adjacent heat dissipating fin. According to this embodiment, since it is not necessary to use a connecting member, the components can be reduced in number. FIG. 15 is a view illustrating still another embodiment of heat dissipating fins. As illustrated in FIG. 15, a U-shaped portion of an approximately U-shaped heat dissipating fin 2 is press-fixed to that of another approximately U-shaped heat dissipating fin 2 without using a connecting bar member. According to this embodiment, since it is not necessary to use a connecting member, the components can be reduced in number.

Figure 16:
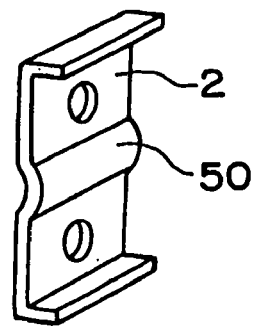
FIG. 16 is a view showing an embodiment of a heat dissipating fin having a portion which functions as a spring.

Further, the heat dissipating fin in accordance with the present invention has a portion with an spring action. FIG. 16 is a view showing an embodiment of a heat dissipating fin which has a spring action. As illustrated in FIG. 16, the approximately U-shaped heat dissipating fin 2 is provided with a curved portion 50 in the center thereof. The curved portion thus provided in the center of the heat dissipating fin allows the heat dissipating fin to have a spring action in the longitudinal direction.

Figure 17A:
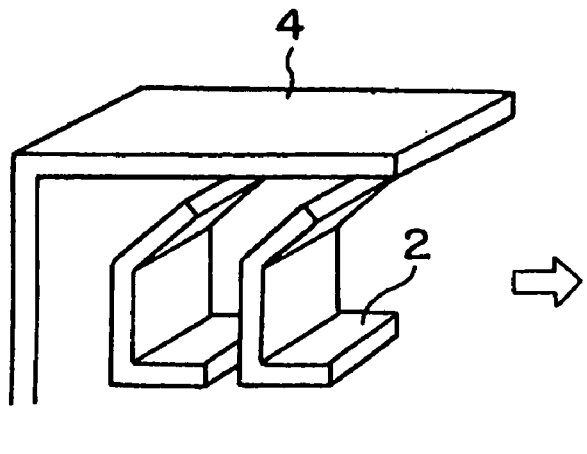
FIGS. 17A and 17B are views each showing an embodiment of heat dissipating fins having a portion which functions as a spring.
Figure 17B:
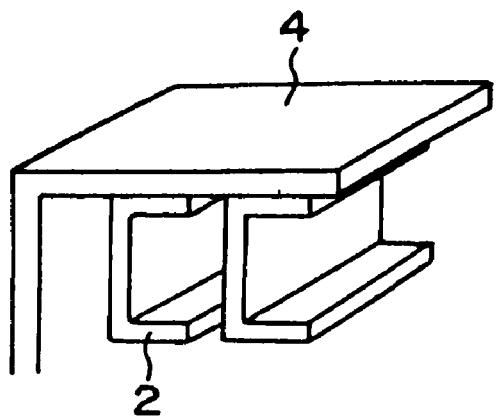

FIGS. 17A and 17B are views each showing an embodiment of heat dissipating fins having a spring action. As shown in FIG. 17A, the upper portion of each of the approximately U-shaped heat dissipating fins, which is in contact with a fixing member 4, is slopped. Then, as shown in FIG. 17B, the upper portion of each of the approximately U-shaped heat dissipating fins is pressed down by the fixing member 4 and put in the horizontal position, and each of the heat dissipating fins is provided with a spring action. Due to the spring action of the heat dissipating fins, the fixing member and the heat dissipating fins are pressed against each other. Thus, close contact between the members is strengthened and the heat transfer efficiency between the members is enhanced.

Figure 18:
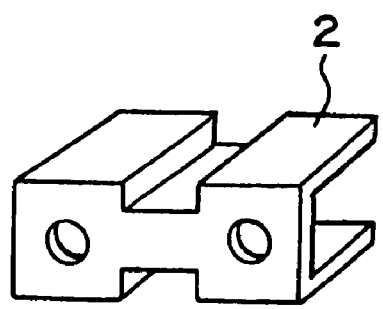
FIG. 18 is a view showing yet another embodiment of a heat dissipating fin.

FIG. 18 is a view showing yet another embodiment of a heat dissipating fin. As illustrated in FIG. 18, for example, the heat dissipating fin has recessed portions formed in the almost center of the upper portion and bottom portion thereof. The recessed portions thus formed make a flow of wind to become turbulent, thereby enhancing the heat dissipating efficiency. Instead of the recessed portion, the heat dissipating fin may be provided with a slit or protrusion.

Figure 19:
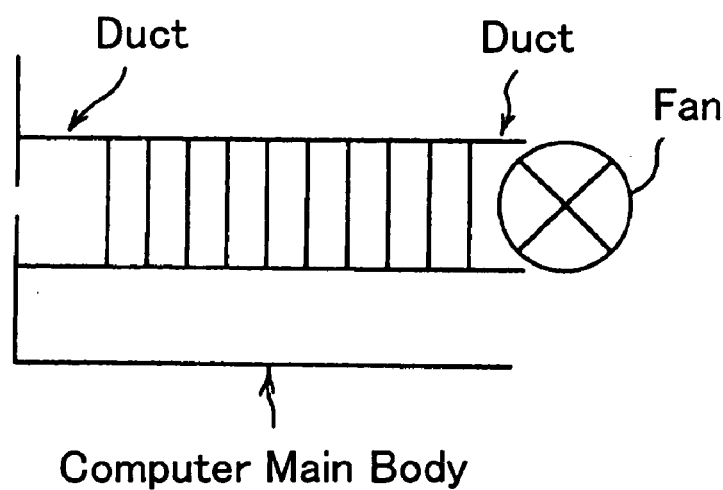
FIG. 19 is a view showing an embodiment of heat dissipating fins having a duct function.

FIG. 19 is a view showing an embodiment of heat dissipating fins having a duct function. As seen from FIG. 19, shielding plates are provided ahead and behind the heat dissipating fins so as to prevent a flow of wind from escaping through a gap. According to this embodiment, heat dissipating efficiency can be further improved.

Figure 20A:
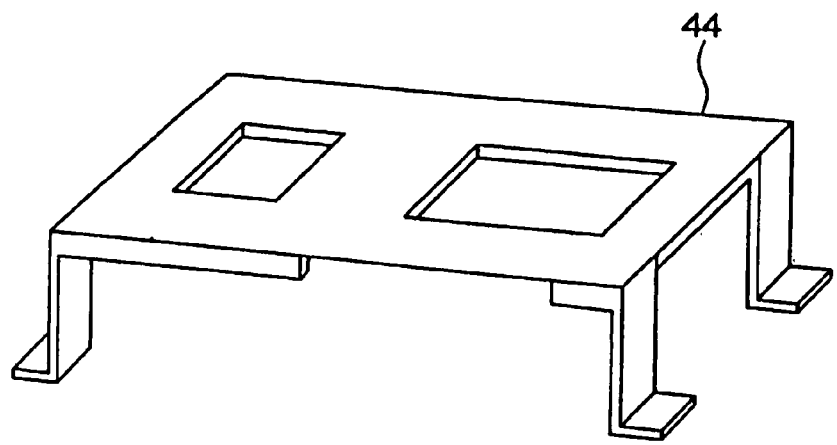
FIGS. 20A and 20B are views each showing another embodiment of a heat sink of the present invention.
Figure 20B:
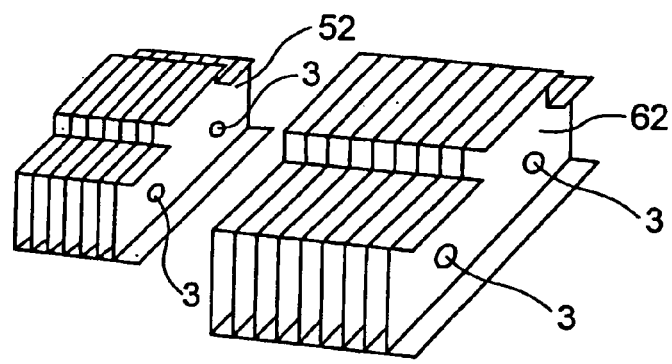
Figure 20B:
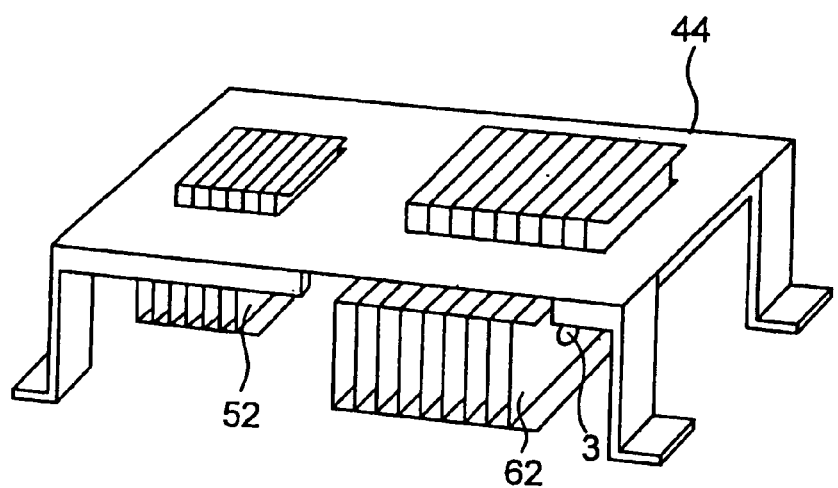

FIGS. 20 are views each showing another embodiment of a heat sink of the present invention. Specifically, FIG. 20A is a view illustrating components of the heat sink of the present invention. FIG. 20B is a view illustrating a heat sink of the present invention which is made up of the components shown in FIG. 20A. As shown in FIG. 20A, the heat sink in accordance with this embodiment comprises: two groups of heat dissipating fins 52 and 62, corresponding to two heat generating electronic components of different heights mounted on the printed board, said heat dissipating fins having bottom portions which form heat receiving surfaces thermally connected to the heat generating electronic components via a heat transfer member; and a fixing member 44 for fixing the two groups of heat dissipating fins 52 and 62 to the printed board when the heat receiving surfaces are left thermally connected to the heat generating electronic components. Of each of the two groups of heat dissipating fins 52 and 62, the plurality of heat dissipating fins arranged in parallel are connected by connecting members 3 which pass through each of the heat dissipating fins, in such manner that the bottom portions thereof form said heat receiving surfaces.

Each of the heat dissipating fins of the heat dissipating fin groups 52 and 62 has a high center portion and low shoulder portions, as shown in FIG. 20A. Further, the center portion and shoulder portions of the heat dissipating fin have respective upper surfaces in parallel with a bottom portion thereof, presenting a modified U-shape. The fixing member 44 has rectangular apertures formed so large to receive the above-mentioned center portions of the heat dissipating fins of the both groups. As shown in FIG. 20B, the shoulder portions of the heat dissipating fin groups 52 and 62 are pressed down by the fixing member 44, and thereby, the bottom portions of the heat dissipating fin groups, which are heat receiving surfaces, are brought into close contact with the heat generating electronic components (not shown) and are thermally connected thereto.

Figure 21:
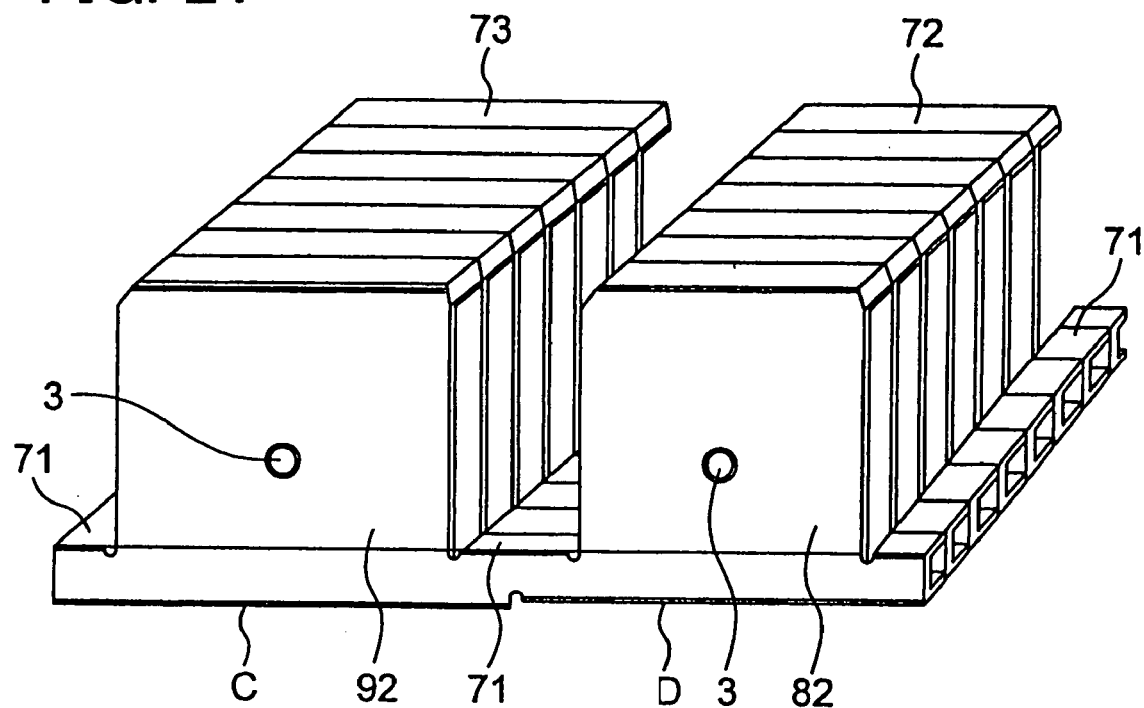
FIG. 21 is a view showing another embodiment of heat dissipating fins of the present invention.

FIG. 21 is a view illustrating another embodiment of the heat dissipating fins in accordance with the present invention. As shown in FIG. 21, the heat sink in accordance with this embodiment comprises: a plurality of heat dissipating fins having bottom portions which form one piece of two heat receiving surfaces C and D thermally connected via a heat transfer member to two heat generating electronic components of different heights mounted on the printed board; and connecting members for, by passing through each of the plurality of heat dissipating fins in parallel, contacting the plurality of heat dissipating fins in such a manner that the bottom portions of the heat dissipating fins form the heat receiving surfaces. More specifically, each of the heat dissipating fins is approximately U-shaped fin, comprising a first portion 71, a second portion 82 and a third portion 92. On the heat receiving surfaces C and D, the first portion is formed partially different in height so as to have upper surfaces thereof at the same distance from the upper surface of the printed board, and the second portion and third portion are formed to be of equal heights and integral with the first portions, corresponding to the heat receiving surfaces C and D. There is provided a predetermined space between the second portion 82 and the third portion 92 to produce a desired flow of air.

Figure 22:
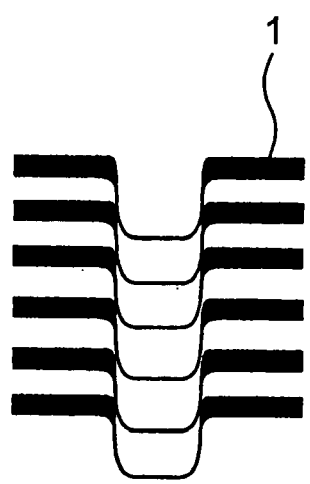
FIG. 22 is a view showing still another embodiment of heat dissipating fins.

FIG. 22 is a view illustrating still another embodiment of the heat dissipating fins. As shown in FIG. 22, each of the heat dissipating fins has a portion subjected to drawing. The drawn portion is press-inserted into another, thereby to fix a plurality of heat dissipating fins 1 in parallel without using a connecting bar member. According to this embodiment, since it is not necessary to use a connecting member, components can be reduced in number.

Figure 23:
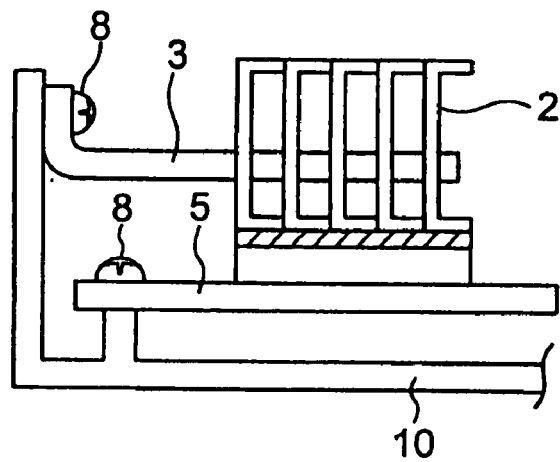

FIG. 23 is a view illustrating an embodiment of a heat sink of which an end of a connecting member and a printed board are fastened on a housing with screws or the like. In the embodiment as shown in FIG. 7, one end of the connecting member is also fastened onto the printed board. However, it is also possible, as shown in FIG. 23, that the printed board is fastened on the housing with a screw or the like and then, an end of the connecting member is fastened on the housing with a screw or the like.

In addition, in the present invention, each of the aforementioned heat dissipating fins is an approximately U-shaped heat dissipating fin with an upper portion and a bottom portion, and may further comprise a region having a stopper function to maintain a predetermined fin pitch on the upper portion.

Figure 24:
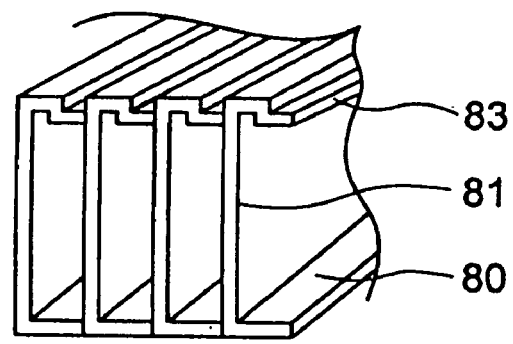
FIG. 24 is a partially enlarged view showing still another embodiment of heat dissipating fins of the present invention.

FIG. 24 is a partially enlarged view showing still another embodiment of heat dissipating fins of the present invention. Specifically, as shown in FIG. 24, the upper portion 83 of each of a plurality of approximately U-shaped heat dissipating fins arranged in parallel has a bent portion at the front which is bent toward the bottom portion of the heat dissipating fin. This bent portion comprises a stopper function. By using a heat dissipating fin in accordance with this embodiment, even when pressure in a slanting direction is applied to the heat dissipating fin, the upper portion of the heat dissipating fin is not pressed outward nor deformed, and therefore the predetermined fin pitch can be kept.

Figure 25:
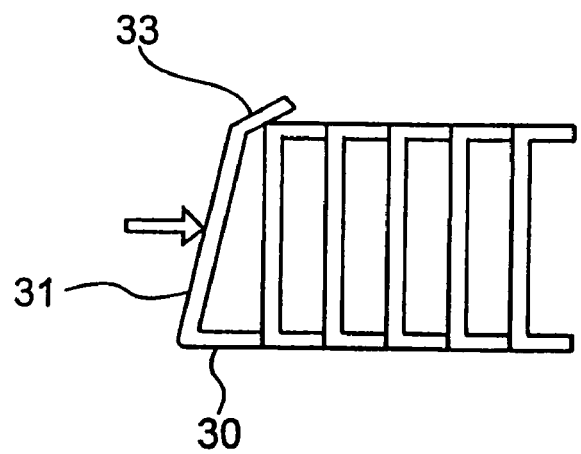
FIG. 25 is a view which illustrates a fin pitch being off the predetermined one.

More specifically, for example as indicated by the arrow in FIG. 25, when more than predetermined force is applied to heat dissipating fins, a tip end of the upper portion 33 of a heat dissipating fin is moved in a slanting direction along the outer surface of the adjacent heat dissipating fin and deformed, and then, the fin pitch is got off the predetermined one. On the other hand, as shown in FIG. 24, where the upper portion 83 of each of approximately U-shaped heat dissipating fins has a bent portion at the front which is bent toward the bottom portion of the heat dissipating fin, even when more than predetermined force is applied to the heat dissipating fins, the bent tip end functions as a stopper, the heat dissipating fin is not deformed, and therefore, the predetermined fin pitch can be maintained between the heat dissipating fin and an adjacent heat dissipating fin.

FIGS. 26 are partially enlarged views showing various embodiments of an upper portion of a fin which has a stopper function.

Figure 26A:
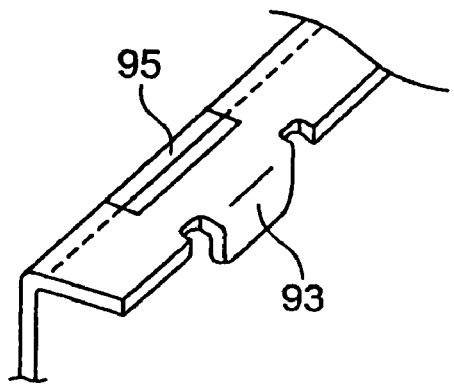
FIGS. 26A to 26E are partially enlarged views showing various embodiments of an upper portion of a fin which has a stopper function.

In an embodiment as shown in FIG. 26A, the heat dissipating fin is provided with an aperture 95 and a corresponding extending portion 93. The extending portion 93 is inserted into an aperture of an adjacent heat dissipating fin and fixed thereto. Thus, the heat dissipating fins arranged in parallel are fixed to each other. Accordingly, also in the present embodiment, even when more than predetermined force is applied to the heat dissipating fins, the heat dissipating fins are not deformed since the heat dissipating fins are secured to each other. Therefore, the predetermined fin pitch can be maintained between adjacent heat dissipating fins.

Figure 26B:
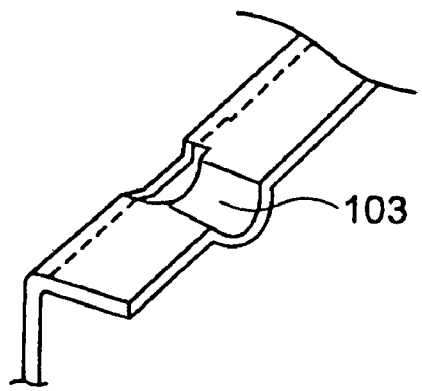

In an embodiment as shown in FIG. 26B, the upper portion of the heat dissipating fin has a curved portion 103 which is curved in a direction of the bottom portion. Since the curved portion 103 functions as a stopper against an adjacent heat dissipating fin, the heat dissipating fin is not deformed. Accordingly, the predetermined fin pitch can be maintained between the heat dissipating fin and the adjacent one.

Figure 26C:
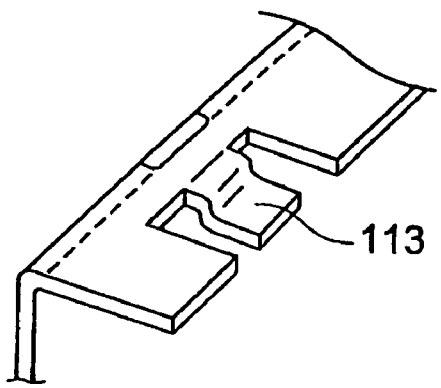

In an embodiment as shown in FIG. 26C, a bent portion 113 is provided independently in the center of the upper portion. The bent portion is such as bent toward the bottom portion and placed at a level closer to the bottom portion than that of the remaining part of the upper portion. Since the bent portion 113 functions as a stopper against an adjacent heat dissipating fin, the heat dissipating fin is not deformed. Accordingly, the predetermined fin pitch can be maintained between the heat dissipating fin and the adjacent one.

Figure 26D:
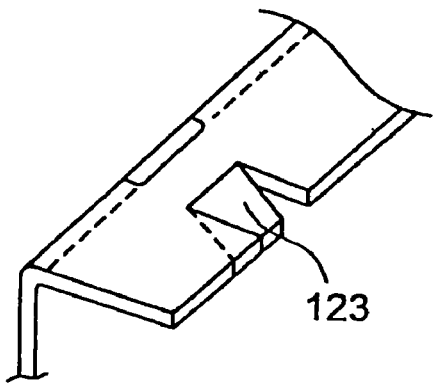

In an embodiment as shown in FIG. 26D, the upper portion of the heat dissipating fin has a sloped portion 123 provided independently in the center thereof. The slopped portion 123 is such as slopped toward the bottom portion. Since the slopped portion 123 functions as a stopper against an adjacent heat dissipating fin, the heat dissipating fin is not deformed. Accordingly, the predetermined fin pitch can be maintained between the heat dissipating fin and the adjacent one.

Figure 26E:
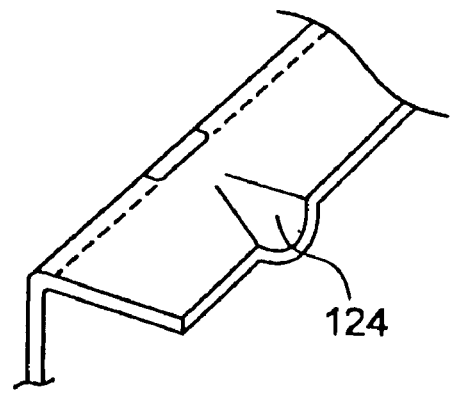

In an embodiment as shown in FIG. 26E, the upper portion of the heat dissipating fin has a conical recess 124 provided in the center thereof. The recess 124 has a shape of circular cone recessed toward the bottom direction, and placed at a level closer to the bottom portion than that of the remaining part of the upper portion. Since the recess 124 functions as a stopper against the adjacent heat dissipating fin, the heat dissipating fin is not deformed. Accordingly, the predetermined fin pitch can be maintained between the heat dissipating fin and the adjacent one.

A portion which substantially functions as a stopper, other than those described above, may be provided to the upper side of a heat dissipating fin A heat dissipating method for electronic devices in accordance with the present invention is such that a plurality of heat dissipating fins are arranged in parallel in such a manner that bottom portions of said heat dissipating fins form a heat receiving surface, said plurality of heat dissipating fins in parallel are connected by a connecting member which passes through each of said heat dissipating fins, and said heat receiving surface formed of the bottom portions of said plurality of heat dissipating fins is thermally connected to a heat generating electronic component.

Further, a heat dissipating method for electronic devices in accordance with the present invention is such that a plurality of heat dissipating fins are arranged in parallel in such a manner that bottom portions of said heat dissipating fins form a plurality of heat receiving surface, said plurality of heat dissipating fins in parallel are connected by a connecting member which passes through each of said heat dissipating fins, and said plurality of heat receiving surfaces formed of the bottom portions of said plurality of heat dissipating fins are thermally connected to a plurality of heat generating electronic components of different heights mounted on a printed board.

According to a heat sink of the present invention, since a heat receiving surface can be formed integral with heat dissipating fins, it is possible to transfer heat from a heat source directly to the heat dissipating fins only via a heat transfer rubber sheet or the like. Further, it is also possible to provide a compact and lightweight heat sink with no more than 1 mm fin pitch. Furthermore, as described above, by eliminating the need for a metal block or the like to be used as a heat receiving member, it is possible to reduce the components in number.

EXAMPLES

The heat sink in accordance with the present invention will be described in more detail with reference to examples.

Example 1

A heat generating element (of 34 mm in length, 34 mm in width, 2 mm in height and 10W in heating value) mounted on a board (of 150 mm in length, 70 mm in width and 1.2 mm in thickness) of an electronic device was subjected to forced cooling with a ventilation fan, using a heat sink of the present invention as described below.

Specifically, seventeen heat dissipating fins of the present invention, of which each is a U-shaped heat dissipating fin of 20 mm in length, 34 mm in width and 0.4 mm in thickness having upper and bottom portions of 2 mm in length, are continuously press-fitted with a pitch of 2 mm into an axle of Φ 2.5 mm and 35 mm in length. A heat transfer rubber sheet (of 34 mm in length, 34 mm in width, 1 mm in thickness and 2.5 W/mk in heat conductivity) was adhered onto the heat generating element. The board and the heat sink are screwed on each other, using a fixing member, at a position of the heat transfer rubber sheet being of 0.8 mm in thickness. A wind of 1.5 m/s in wind velocity flowed through the corrugated fins.

The operation was operated for two hours, the surface temperature of the heat generating element was measured. As a measurement result, a temperature rise from outside air temperature value was 20. degree. C. and heat resistance including the heat transfer rubber sheet was 4.3. degree. C./W, thus presenting excellent performance.

Example 2

Two heat generating elements (C: of 28 mm in length, 28 mm in width, 2 mm in height and 25W in heating value; and D: of 45 mm in length, 39 mm in width, 4 mm in height and 20W in heating value) mounted on a board (of 150 mm in length, 70 mm in width and 1.2 mm in thickness) of an electronic device was subjected to forced cooling with a ventilation fan, using a heat sink of the present invention as described below.

Specifically, as shown in FIG. 20, seven heat dissipating fins 52, of which each is a U-shaped heat dissipating fin of 0.3 mm in thickness and has: a center portion of 22 mm in height and 20 mm in length; and shoulder portions of 18 mm in height and 4 mm in length formed at both sides of the center portion, were arranged in parallel with 4 mm pitch and fixed by connecting bars at the position corresponding to the heat generating element C.

Further, other thirteen heat dissipating fins 62, of which each is a U-shaped heat dissipating fin of 0.3 mm in thickness and has: a center portion of 22 mm in height and 30 mm in length; and shoulder portions of 18 mm in height and 9 mm in length formed at both sides of the center portion, were arranged in parallel with 3 mm pitch and fixed by connecting bars at the position corresponding to the heat generating element D. The heat dissipating fins 52 and 62 were press-fixed onto the heat generating elements C and D on the board by a fixing member 44 which has apertures for receiving both of the center portions. A heat transfer rubber sheet (of 34 mm in length, 34 mm in width, 1 mm in thickness and 2.5 W/mk in heat conductivity) was adhered onto each of the heat generating elements. The board and the heat sink are screwed on each other, using a fixing member, at a position of the heat transfer rubber sheet being of 0.8 mm in thickness. A wind of 1.2 m/s in wind velocity flowed through the corrugated fins.

The operation was operated for two hours, the surface temperature of each of the heat generating elements was measured. As a measurement result, a temperature rise from outside air temperature value was 20. degree. C. and heat resistance including the heat transfer rubber sheet was 2. degree. C./W, thus presenting excellent performance.

INDUSTRIAL APPLICABILITY

As described above, according to the present invention, it is possible to provide a heat sink for cooling electronic devices or the like, which has a reduced contact heat resistance between a metal block and a heat dissipating fin, uniform cooling performance irrespective of products, reduced unnecessary radiation and excellent cooling performance, and a heat dissipating method, said heat sink and heat dissipating method being of superior industrial utilization value.

What is claimed is:

1. A heat sink comprising:
    a plurality of heat dissipating fins of different heights, said heat dissipating fins having at least bottom portions which form a plurality of heat receiving surfaces thermally connected to a plurality of beat generating electronic components of different heights mounted on a printed board; and
    a connecting member for, by passing through each of said plurality of heat dissipating fins arranged in parallel, connecting said plurality of heat dissipating fins in such a manner that said bottom portions form said heat receiving surfaces.

2. The heat sink as claimed in claim 1, further comprising a fixing member for fixing said heat dissipating fins, which are connected by said connecting member, by pressing said plurality of heat dissipating fins against said heat generating electronic components while said heat receiving surfaces are thermally connected to said heat generating electronic components.

3. The heat sink as claimed in claim 2, further comprising an electrically conductive sheet for shielding a magnetic field arranged between upper portions of said heat dissipating fins and said fixing member.

4. The heat sink as claimed in claim 1, wherein each of said heat dissipating fins comprises an approximately U-shaped beat dissipating fin having an upper portion, a main body portion and a bottom portion, and includes a portion having a stopper function to maintain a predetermined fin pitch at said upper portion.

5. The heat sink as claimed in claim 1, wherein said heat dissipating fins comprises approximately L-shaped heat dissipating fins or approximately U-shaped beat dissipating fins having said bottom portions.

6. The heat sink as claimed in claim 1, wherein said heat dissipating fins are connected to one end of a heat pipe, and an other end of the heat pipe is further thermally connected to another heat dissipating portion or another heat receiving portion.

7. The heat sink as claimed in claim 1, wherein each of said heat dissipating fins has a portion which functions as a stopper.

8. The heat sink as claimed in claim 7, wherein said portion which functions as a stopper comprises a curved portion curved in a direction to the bottom portion, which is provided at the upper portion of each of said heat dissipating fins.

9. The heat sink as claimed in claim 7, wherein said portion which functions as a stopper comprises an aperture and a corresponding extended portion provided at the upper portion of each of said heat dissipating fins, and said extending portion is inserted into an aperture of an adjacent heat dissipating fin.

10. The heat sink as claimed in claim 1, wherein said heat dissipating tins are approximately L-shaped heat dissipating fins or approximately U-shaped heat dissipating fins having said bottom portions, and comprise at least two groups of heat dissipating fins of different heights, corresponding to at least two heat generating electronic components of different heights.

11. A method for heat dissipating an electronic device which comprises:
arranging a plurality of heat dissipating fins of different heights in parallel in such a manner that bottom portions of said heat dissipating fins form a plurality of heat receiving surface;
connecting said plurality of heat dissipating fins arranged in parallel by a connecting member which passes through each of said heat dissipating fins; and
thermally connecting said plurality of heat receiving surfaces formed of the bottom portions of said plurality of heat dissipating fins to a plurality of heat generating electronic components of different heights mounted on a printed board.

12. The method as claimed in claim 11, wherein each of said heat dissipating fins is an approximately U-shaped heat dissipating fin having an upper portion, a main body portion and a bottom portion, and includes a portion having a stopper function to maintain a predetermined fin pitch at said upper portion.

* * * * *